(12) United States Patent
Thurairajaratnam et al.

(10) Patent No.: US 6,555,914 B1
(45) Date of Patent: Apr. 29, 2003

(54) INTEGRATED CIRCUIT PACKAGE VIA

(75) Inventors: Aritharan Thurairajaratnam, Freemont, CA (US); Pradip D. Patel, Redwood City, CA (US); Manickam Thavarajah, San Jose, CA (US); Hong T. Lim, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/975,871

(22) Filed: Oct. 12, 2001

(51) Int. Cl.$^7$ .................. H01L 23/52; H01L 21/44; H01L 21/76; B05D 5/12
(52) U.S. Cl. .............. 257/773; 257/774; 257/777; 257/778; 257/786; 438/108; 438/107; 438/406; 438/455; 427/96; 427/97; 427/98
(58) Field of Search .................. 438/455, 406, 438/26, 109, 127, 108; 427/96–98, 103; 257/773, 774, 778, 777, 781, 786, 503

(56) References Cited

U.S. PATENT DOCUMENTS 5,929,510 A * 7/1999 Geller et al.
6,016,084 A * 1/2000 Sugimoto \* cited by examiner Primary Examiner—Ha Tran Nguyen
(74) Attorney, Agent, or Firm—Luedeka, Neely & Graham

(57) ABSTRACT

A method of forming a via in a circuit, such that parasitic capacitance is reduced. The surface layers of the circuit are identified, to which continuity with the via is desired, and secondary layers of the circuit are also identified. Via lands are formed only on the surface layers and not on the secondary layers. The via lands are formed in first portions of the surface layers, where the via is to pass through the surface layers. Nonconductive cut outs are formed in second portions of the secondary layers where the via is to pass through the secondary layers. The surface layers and the secondary layers of the circuit are laminated together. The first portions of the surface layers are aligned with the second portions of the secondary layers. A through hole is formed through the via lands formed in the surface layers, and also through the cut outs formed in the secondary layers. The via is formed in the through hole. The parasitic capacitance of the via is reduced by not having via lands on the secondary layers.

14 Claims, 2 Drawing Sheets

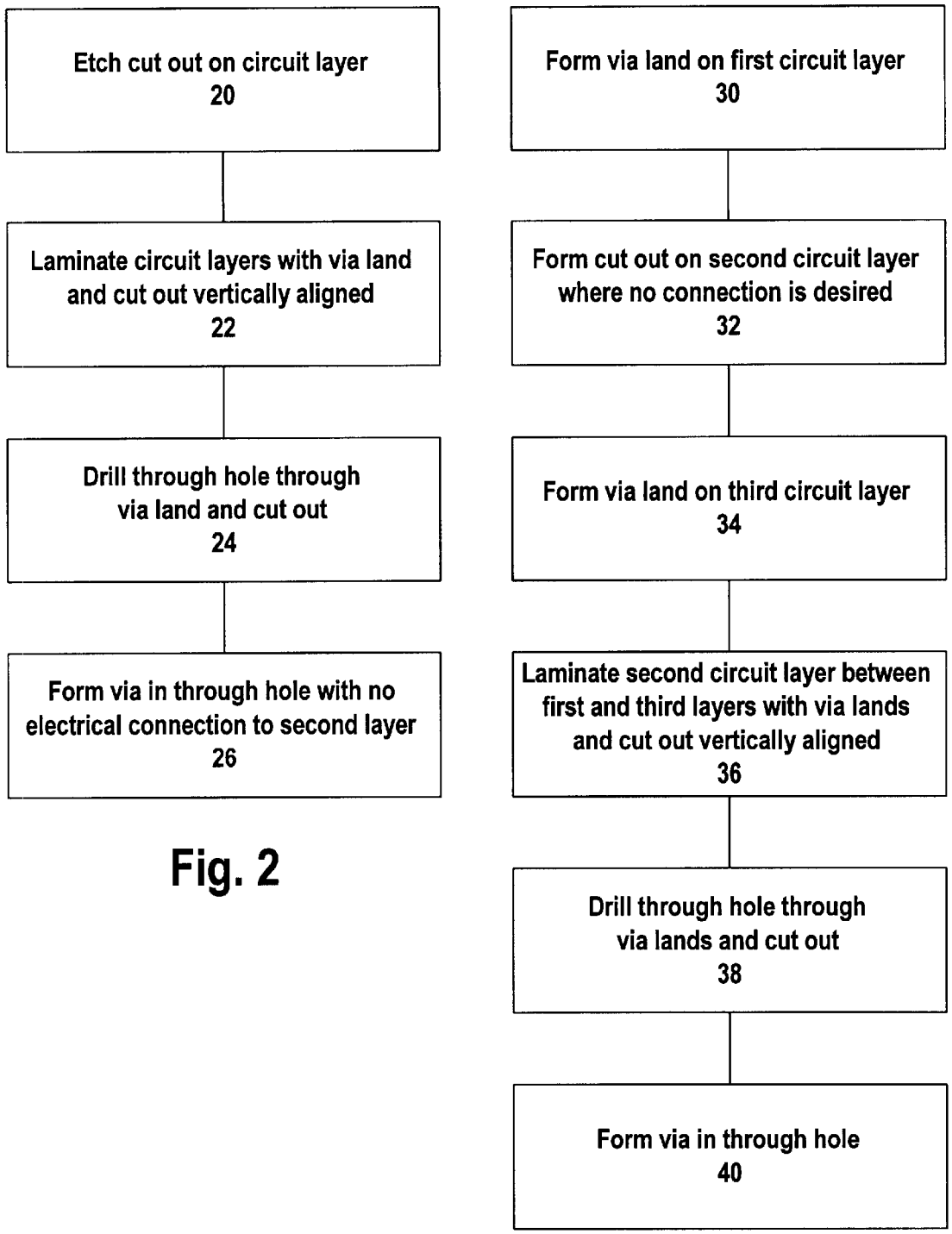

INTEGRATED CIRCUIT PACKAGE VIA

FIELD

This invention generally relates to the field of printed circuit boards and integrated circuit packages. More particularly, this invention relates to reducing parasitic capacitance in the electrically conductive vias of printed circuit boards and integrated circuit packages.

BACKGROUND

Printed circuit boards and integrated circuit package substrates, typically referred to as laminates, are commonly used in the electronic industry. The laminates are often constructed from layers of material on which circuitry has been printed, such as signal lines, power planes, and ground planes. The layers of the laminate are typically electrically connected by mechanically drilling holes through electrically conductive via lands that have been etched in the electrically conductive layers of the laminate. The via lands may be used in part to align the drilling equipment and provide a suitable surface for the drilling process. Vias or plated through holes are constructed in the holes that are drilled, by plating the holes with an electrically conductive material to selectively connect the various layers, such as ground and power planes, to other circuits in the laminate.

As such laminates become smaller and smaller with the commensurate reduction in the size of integrated circuit, problems such as unwanted parasitic capacitance tend to occur between the various elements of the laminate. This parasitic capacitance becomes especially pronounced as the speed at which the circuit is operating increases.

Like other elements of the laminate, the drilled via lands of the various layers tend to induce unwanted parasitic capacitance. Furthermore, the manufacturing process of the laminates requires precision etching of the via lands and the cut outs that must surround some of the via lands. These positional and dimensional accuracies tend to be needed to maintain the accurate alignment of the via lands on different layers, such as during the lamination of the layers. If these accuracies are not met, the manufacturing yields of the laminates may be sacrificed, and as a result the cost of manufacturing the circuit boards and packages increases.

SUMMARY

The above and other needs are met by a method of forming an electrically conductive via in a layered circuit structure, such that parasitic capacitance is reduced in the electrically conductive via. The surface layers (top and bottom) of the layered circuit structure are identified, to which electrical continuity with the electrically conductive via is desired, and the secondary layers of the layered circuit structure are also identified, to which electrical continuity with the electrically conductive via is not desired.

Via lands are formed only on the surface layers, to which electrical continuity with the electrically conductive via is desired, and not on the secondary layers, to which electrical continuity with the electrically conductive via is not desired. The via lands are formed in the first portions (through hole areas) of the surface layers, where the electrically conductive via is to pass through the surface layers. Electrically nonconductive cut outs are selectively formed in second portions of the secondary layers where the electrically conductive via is to pass through the secondary layers. The cut outs have a diameter that is smaller than that which would be required had via lands been formed for the electrically conductive via on the secondary layers.

The surface layers and the secondary layers of the layered circuit structure are laminated together. The first portions of the surface layers, where the electrically conductive via is to pass through the surface layers, are aligned with the second portions of the secondary layers, where the electrically conductive via is to pass through the secondary layers. A through hole is formed through the via lands in the first portions of the surface layers, and also through the cut outs formed in the second portions of the secondary layers.

The electrically conductive via is formed in the through hole such that the electrically conductive via passes through and makes electrical contact with the via lands of the surface layers, and passes through the cut outs of the secondary layers without making electrical contact to the secondary layers. The parasitic capacitance of the electrically conductive via is reduced by not having via lands on the secondary layers.

By not having via lands on layers of the layered circuit structure that do not require electrical connection with the associated via, the parasitic capacitance associated with the via land proximity to other metallization structures is virtually eliminated, especially for circuits functioning at higher frequencies of operation. Furthermore, etching the cut outs and subsequent alignment of the layers during lamination tends to require a less precise manufacturing process without these unneeded via lands. Thus, the efficiency and yield of the manufacturing process used to build the layered circuit structure is generally increased. The current density and distribution on these circuit layers may also be enhanced, since the diameter of a cut out that doesn't surround a via land is generally smaller than the diameter of a cut out that does surround a via land.

In various preferred embodiments, the layered circuit structure further comprises one of a printed circuit board and an integrated circuit package substrate. Preferably, multiple electrically conductive vias are formed in the layered circuit structure. The cut outs are preferably formed by etching the electrically nonconductive cut outs into an electrically conductive layer on the secondary layers. The via is preferably formed by plating the through hole with copper. In a most preferred embodiment, the steps of the method are performed sequentially.

According to another aspect of the invention there is described a layered circuit structure having an electrically conductive through hole formed according to the method described above.

As previously discussed, the reduced parasitic capacitance that results from the removal of the via lands from the layered circuit structure tends to increase the performance of the layered circuit structure. In addition, the cut outs are much simpler to manufacture and align without the via lands.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 2 is a flow chart of a preferred method in accordance with the present invention, and FIG. 3 is a flow chart of an alternative method in accordance with the present invention.

DETAILED DESCRIPTION

Figure 1:
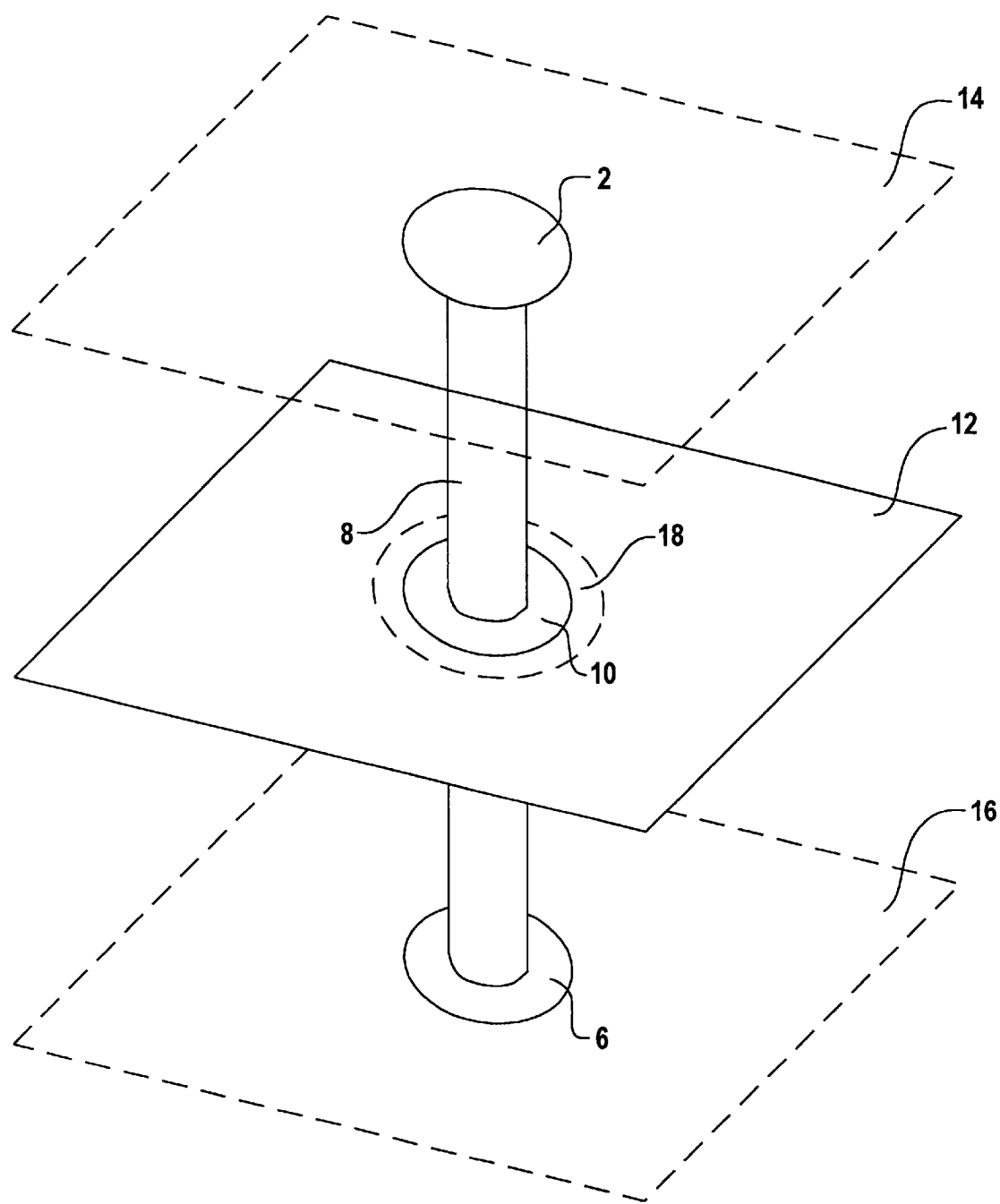
FIG. 1 is a representation of a preferred embodiment of the present invention.

The present invention is directed toward a layered circuit structure and a method of constructing the layered circuit structure that reduces parasitic capacitance. Circuits such as printed circuit boards and integrated circuit package substrates are generally constructed as laminate structures that include layers of circuit elements. In addition, ground planes and power planes are provided to supply power and ground. Because the circuit is constructed from layers that are laminated over one another, provision must be made for electrically interconnecting the various laminated layers to one another.

Typically, through holes are mechanically drilled through the layers and electrically conductive vias are constructed in the holes to selectively electrically connect the various layers as desired. Via lands that consist of a small area of metal are typically constructed on the layers in the areas where the vias or plated through holes will pass through the layers. The via lands are used during the manufacturing process to, among other things, provide a tolerance region for the drilling equipment. In addition, the via lands provide a suitable surface for drilling that tends to be less likely to crack or shatter than some others of the materials from which circuit boards are constructed. While the via lands tend to be helpful during the manufacturing process, they tend to play no role in the function of the completed circuit. In fact, as the present inventors have discovered, the via lands tend to introduce unwanted parasitic capacitance into the circuit. Furthermore, as the frequency of operation increases, the parasitic capacitance increases.

As shown in FIG. 1, a preferred embodiment of the present invention minimizes the parasitic capacitance present in a laminated circuit structure by not placing a via land on a circuit layer 12 to which no electrical connection with the via 8 is required. An etched out area 10 is provided on the layer 12, through which the through hole is drilled. By eliminating the conductive material that makes up the via land from the circuit layer 12, the amount of parasitic capacitance present in the circuit structure is decreased. This improves the performance of the circuit by reducing the likelihood of an error when the circuit is operating in a high frequency mode of operation due to the parasitic capacitance of the circuit. In addition, the need to precisely etch out a via land within the cut out 10 is preferably eliminated, thereby improving the efficiency and yield of the process.

The diameter of the cut out 10 may be made smaller than the diameter of a cut out 18 that would surround a via land. The cut out 10 only needs to be large enough for the via 8 to pass through the circuit layer 12 without electrically contacting electrical circuitry on the circuit layer 12. Thus, the current density and distribution on the circuit layer 12 may be enhanced through the use of the above-discussed embodiment of the present invention. It is appreciated that the cut out 10 is an area of electrically non-conductive material, such as the circuit board material, in a field of conductive material, such as may be present on a ground plane or a power plane.

Also depicted in phantom in FIG. 1 are two other circuit layers 14 and 16 on which via lands 2 and 6 have been formed. The via lands 2 and 6 are typically desirable when electrical contact is desired between the via 8 and the circuitry on the circuit layers 14 and 16 on which the via lands 2 and 6 reside. Preferably, there is no via land, but only a cut out 10 on the circuit layers such as circuit layer 12 to which no electrical connection to the via 8 is desired. The electrical circuitry that may be present on the various circuit a layers 12, 14, and 16 has not been depicted so as to not unnecessarily encumber the figure.

Referring now to FIG. 2, a flow chart of a preferred method in accordance with the present invention is shown. The method commences in block 20 where the cut out 10 is etched on a circuit layer of a layered circuit structure. The cut out is preferably formed by etching away a conductive material on the circuit layer from the desired cut out 10. Other circuit layers, where electrical connections to the via is desired, are formed with via lands as per the prior art. In block 22, circuit layers are laminated together such that via lands on surface circuit layers and cut outs on secondary circuit layers are vertically aligned. Once the circuit layers have been laminated over one another, a through hole is preferably mechanically drilled through the via lands and the cut outs as set forth in block 24. In block 26, a via is formed in the through hole such that an electrical connection is formed between the via and the via lands and no electrical connection is formed between the via and the circuit layers on which the cut outs are formed. The via may be formed in the through hole by depositing a conductive material such as copper.

The removal of the via lands from the circuit layers to which no electrical connection is desired eliminates a portion of the conductive material that is causing the parasitic capacitance in the circuit at high frequencies of operation. By reducing the parasitic capacitance, the frequency of operation of the circuit can preferably be increased.

Referring now to FIG. 3, an alternate method in accordance with the present invention is shown. The method commences with the step of forming a via land on a top circuit layer as shown in block 30. In block 32, a cut away area is etched in a secondary circuit layer where it is not desired to make electrical connection with a via. An example of such a circuit layer would be a ground plane or power plane such as commonly found in an integrated circuit package substrate, to which the via is not to be electrically connected. In block 34, a bottom circuit layer having a via land is formed. The secondary circuit layer is laminated between the top and bottom circuit layers such that the cut out on the secondary circuit layer is vertically aligned with the via lands on the top and bottom circuit layers, as given in block 36. The method then proceeds to block 38 where a through hole is drilled through the via lands and the cut out. The method ends with the formation of a via in the through hole, as given in block 40.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of forming an electrically conductive via in a layered circuit structure such that parasitic capacitance is reduced in the electrically conductive via, the method comprising the steps of:

identifying surface layers of the layered circuit structure to which electrical continuity with the electrically conductive via is desired, identifying secondary layers of the layered circuit structure to which electrical continuity with the electrically conductive via is not desired, forming via lands only on the surface layers, to which electrical continuity with the electrically conductive via is desired, and not on the secondary layers, to which electrical continuity with the electrically conductive via is not desired, the via lands being formed in first portions of the surface layers where the electrically conductive via is to pass through the surface layers, selectively forming electrically nonconductive cut outs in second portions of the secondary layers where the electrically conductive via is to pass through the secondary layers, where the cut outs have a diameter that is smaller than that which would be required had via lands been formed for the electrically conductive via on the secondary layers, laminating the surface layers and the secondary layers of the layered circuit structure together, with the first portions of the surface layers where the electrically conductive via is to pass through the surface layers aligned with the second portions of the secondary layers where the electrically conductive via is to pass through the secondary layers, forming a through hole through the via lands formed in the first portions of the surface layers and through the cut outs formed in the second portions of the secondary layers, and forming the electrically conductive via in the through hole such that the electrically conductive via passes through and makes electrical contact with the via lands of the surface layers and passes through the cut outs of the secondary layers without making electrical contact to the secondary layers, where the parasitic capacitance of the electrically conductive via is reduced by not having via lands on the secondary layers.

2. The method of claim 1 wherein the layered circuit structure further comprises one of a printed circuit board and an integrated circuit package substrate.

3. The method of claim 1 wherein multiple electrically conductive vias are formed in the layered circuit structure.

4. The method of claim 1 wherein the step of forming electrically nonconductive cut outs further comprises etching the electrically nonconductive cut outs into an electrically conductive layer on the secondary layers.

5. The method of claim 1 wherein the step of forming the through hole further comprises drilling the through hole with a drill.

6. The method of claim 1 wherein the step of forming the electrically conductive via in the through hole further comprises plating the through hole with copper.

7. The method of claim 1 wherein the steps of the method are performed sequentially.

8. A layered circuit structure, the improvement comprising electrically conductive vias formed according to the method of claim 1.

9. A layered circuit structure with an electrically conductive via having reduced parasitic capacitance, the layered circuit structure comprising:

surface layers to which electrical continuity with the electrically conductive via is desired, secondary layers to which electrical continuity with the electrically conductive via is not desired, via lands formed only on the surface layers, to which electrical continuity with the electrically conductive via is desired, and not on the secondary layers, to which electrical continuity with the electrically conductive via is not desired, the via lands formed in first portions of the surface layers where the electrically conductive via is to pass through the surface layers, electrically nonconductive cut outs selectively formed in second portions of the secondary layers where the electrically conductive via is to pass through the secondary layers, where the cut outs have a diameter that is smaller than that which would be required had via lands been formed for the electrically conductive via on the secondary layers, the surface layers and the secondary layers of the layered circuit structure laminated together, with the first portions of the surface layers where the electrically conductive via is to pass through the surface layers are aligned with the second portions of the secondary layers where the electrically conductive via is to pass through the secondary layers, a through hole extending through the via lands in the first portions of the surface layers and through the cut outs in the second portions of the secondary layers, and the electrically conductive via disposed in the through hole such that the electrically conductive via passes through and makes electrical contact with the via lands of the surface layers and passes through the cut outs of the secondary layers without making electrical contact to the secondary layers, where the parasitic capacitance of the electrically conductive via is reduced by not having via lands on the secondary layers.

10. The layered circuit structure of claim 9 wherein the layered circuit structure further comprises one of a printed circuit board and an integrated circuit package substrate.

11. The layered circuit structure of claim 9 wherein the layered circuit structure has multiple electrically conductive vias.

12. The layered circuit structure of claim 9 wherein the electrically nonconductive cut outs are etched into an electrically conductive layer on the secondary layers.

13. The layered circuit structure of claim 9 wherein the through hole further comprises a drilled hole through the layered circuit structure.

14. The layered circuit structure of claim 9 wherein the electrically conductive via is formed of copper.

* * * * *